United States Patent
Naido et al.

(10) Patent No.: US 12,235,310 B2
(45) Date of Patent: Feb. 25, 2025

(54) SYSTEM AND METHOD FOR ANALYZING FAULT DATA OF A POWER TRANSMISSION NETWORK

(71) Applicant: Hitachi Energy Ltd, Zürich (CH)

(72) Inventors: Obbalareddi Demudu Naido, Bangalore (IN); Neethu George, Bangalore (IN); Nandkishor Kubal, Pune (IN)

(73) Assignee: HITACHI ENERGY LTD, Zürich (CH)

( * ) Notice: Subject to any disclaimer, the term of this patent is extended or adjusted under 35 U.S.C. 154(b) by 689 days.

(21) Appl. No.: 16/760,843

(22) PCT Filed: Dec. 29, 2017

(86) PCT No.: PCT/IB2017/058500
§ 371 (c)(1),
(2) Date: Apr. 30, 2020

(87) PCT Pub. No.: WO2019/086946
PCT Pub. Date: May 9, 2019

(65) Prior Publication Data
US 2021/0165032 A1    Jun. 3, 2021

(30) Foreign Application Priority Data

Oct. 31, 2017  (IN) .............. 201741038730

(51) Int. Cl.
*G01R 31/08* (2020.01)
*G01R 19/25* (2006.01)
*G06F 16/25* (2019.01)

(52) U.S. Cl.
CPC ....... *G01R 31/086* (2013.01); *G01R 19/2513* (2013.01); *G01R 31/088* (2013.01); *G06F 16/254* (2019.01)

(58) Field of Classification Search
None
See application file for complete search history.

(56) References Cited

U.S. PATENT DOCUMENTS 5,399,974 A * 3/1995 Eriksson .................. H02H 7/26
                                                    324/543
5,455,776 A * 10/1995 Novosel ............... G01R 31/088
                                                    324/509

(Continued)

FOREIGN PATENT DOCUMENTS

| CN | 101295873 A | 10/2008 |
|----|-------------|---------|
| CN | 102129013 A | 7/2011  |

(Continued)

OTHER PUBLICATIONS

CN105044554, machine translation (Year: 2015).*

(Continued)

*Primary Examiner* — Shelby A Turner
*Assistant Examiner* — Brandon J Becker
(74) *Attorney, Agent, or Firm* — Slater Matsil, LLP

(57) ABSTRACT

A system can be used for analyzing fault data in a power transmission network with a plurality of power transmission lines. A number of power system devices are distributed across the power transmission network. Each power system device performs one or more of measurement of data to generate measured data and processing of the measured data to generate processed data in response to a condition in a corresponding segment of the power transmission network. The system includes a data aggregator, a data analyzer, and a fault locator.

20 Claims, 5 Drawing Sheets

(56) References Cited

U.S. PATENT DOCUMENTS

| | | |
|---|---|---|
| 6,917,888 B2 | 7/2005 | Logvinov et al. |
| 2007/0156358 A1 | 7/2007 | Saha et al. |
| 2011/0264389 A1 | 10/2011 | Mynam et al. |
| 2016/0299187 A1* | 10/2016 | Liang .................. G01R 31/086 |
| 2016/0352091 A1* | 12/2016 | Qi ............................ H02H 3/38 |
| 2017/0163144 A1* | 6/2017 | Boncato .................. H02M 1/32 |

FOREIGN PATENT DOCUMENTS

| | | |
|---|---|---|
| CN | 102445638 A | 5/2012 |
| CN | 102495336 A | 6/2012 |
| CN | 102809715 A | 12/2012 |
| CN | 103091603 A | 5/2013 |
| CN | 106291230 A | 1/2017 |
| CN | 106501656 A | 3/2017 |
| CN | 106569089 A | 4/2017 |
| CN | 107229004 A | 10/2017 |
| EP | 2600543 A1 | 6/2013 |
| WO | 2013035110 A2 | 3/2013 |
| WO | 2017158608 A1 | 9/2017 |

OTHER PUBLICATIONS

Dragomir et al., "A review of Impedance-based Fault Location Approaches for Transmission Lines," 2014 International Conference and Exposition on Electrical and Power Engineering (EPE 2014), Oct. 16-18, 2014, Iasi, Romania, pp. 1021-1024, total 4 pages.

Guobing et al., "Single-ended Fault Location of Hybrid MMC-HVDC System Based on Active Detection," Power System Technology, vol. 45, Issue 2, Feb. 2021, pp. 730-740, total 11 pages.

* cited by examiner

SYSTEM AND METHOD FOR ANALYZING FAULT DATA OF A POWER TRANSMISSION NETWORK

CROSS-REFERENCE TO RELATED APPLICATIONS

This patent application is a national stage filing of International Application No. PCT/IB2017/058500, filed on Dec. 29, 2017, which is hereby incorporated by reference in its entirety.

TECHNICAL FIELD

The present invention generally relates to electrical power transmission and in specific embodiments to analyzing fault data in a power transmission network.

BACKGROUND

Power transmission networks have become complex over time. A power transmission network today has lines of varying topologies spread across regions. For instance, a network may have different combinations of overhead lines, underground/subsea cables, multi-terminal lines and tapped lines etc. Faults can happen anywhere in a power transmission network. The nature and type of fault varies according to the topology of the line. For example, disturbances due to bad weather conditions may affect overhead lines and cause transient faults, while an insulation fault in a cable is likely to be permanent in nature, warranting service interruption. Some faults can propagate and affect connected lines and power system equipment/devices.

Accurate fault location is critical for taking appropriate action. In case of a servicing requirement, accurate estimation of the faulted location helps maintenance crew to reach to a faulted section and undertake repair work quickly. There are multiple fault location techniques (or methods for locating faults) that can be used based on the available input quantities and topology of the line. For example, a phasor based technique/impedance based technique (or low sampling rate based method), a traveling wave based approach (or high sampling rate method), a time domain based approach etc. may be used for estimating the fault location. Extending the example, according to the availability of data, data from one end or multiple ends/points in the line may be used (e.g., two ended, or junction data along with data from available terminals for fault location). Additionally, there can be variations according to network configurations such as different methods (techniques) may be applied for two terminal or multi-terminal or meshed network configurations.

Currently, fault location techniques (or methods) for electrical power networks are deployed on one or more power system devices (e.g., on Intelligent Electronic Devices (IEDs) on the field). Here, each power system device is typically configured individually to perform certain functions. For example, an IED at an overhead line can monitor electrical parameters to perform protection and auto-reclose functions. Taking another example, a Phasor Measurement Unit (PMU), or a Merging Unit (MU) acquires currents/voltages from measurement equipment (e.g., current/potential transformer (CT/PT)), converts the analog values to digital values, and transmits the measurements through standard communication (such as IEC 61850) to a controller or IED.

In current power system networks, only certain types of power system devices (such as IEDs) can apply fault location techniques (that are designed for the specific devices). Also, depending on the available data and the technique used to estimate the fault location, the accuracy varies. With the available solutions, there is no scope of efficiently locating faults with data available from different power system devices, as well as change the accuracy of estimation of the fault location. In order to change the accuracy of an on-field power system device, one would need to deploy newer versions of the fault location technique(s) specific to the corresponding device, thereby needing re-configuration after deployment. Such re-configuration only changes performance of the specific device, and does not make use of data from other power system devices, or even affect functioning of other power system devices.

There is accordingly need for a system and method for analyzing fault data in a power transmission network, which work for different types of power system devices, power system data (e.g., measured/processed data, synchronized/unsynchronized data etc.), line topologies and network configurations. Additionally, such a system and method should enable seamless update of fault location techniques across the network.

SUMMARY

Embodiments of the invention relate to systems and methods for analyzing fault data in a power transmission network.

A first embodiment is directed to a system for analyzing fault data in a power transmission network with a plurality of power transmission lines. A plurality of power system devices are distributed across the power transmission network. Each power system device performs one or more of measurement of data to generate measured data and processing of the measured data to generate processed data in response to a condition in a corresponding segment of the power transmission network. The system comprises a data aggregator, a data analyzer, and a fault locator.

The data aggregator receives disturbance data from one or more power system devices in response to a fault in a corresponding segment of the power transmission network. The disturbance data received from a power system device comprises one or more of the measured data and the processed data. The one or more power system devices sample data at a corresponding one or more data sampling rates.

The data analyzer for selects a fault location technique for the disturbance data received from each of the one or more power system devices. The fault location technique is selected according to one or more of device details of the power system device, and topology of corresponding power transmission line of the power transmission network. The fault location technique is one of a phasor based fault location technique, a time domain based fault location technique and a travelling wave based fault location technique.

The fault locator for locates the fault in the power transmission network, based on the fault location technique selected with the data analyzer, the disturbance data received from one or more power system devices, the system parameters of the corresponding segment of the power transmission network and geographical information associated with the power transmission network.

Other embodiments are disclosed herein.

BRIEF DESCRIPTION OF THE DRAWINGS

The subject matter of the invention will be explained in more detail in the following text with reference to exemplary embodiments which are illustrated in attached drawings in which.

DETAILED DESCRIPTION OF ILLUSTRATIVE EMBODIMENTS

Figure 1:
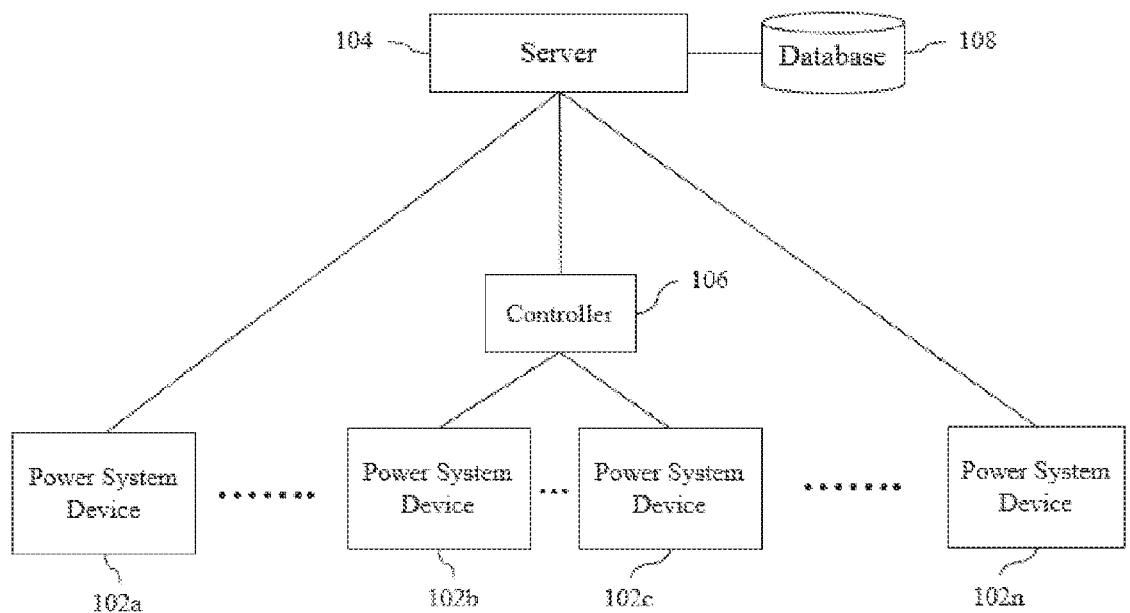
FIG. 1 is a simplified representation of an environment of analyzing fault data, in accordance with an embodiment of the invention.

Various aspects of the invention relate to analyzing fault data in a power transmission network. The power transmission network (network) has a plurality of power transmission lines (lines) spread across a region(s). As an example, the power transmission network can connect multiple substations/terminals with multiple overhead lines and cables. In accordance with the invention, the topology of a line of the network can be one of, but not limited to, a multi-terminal line, a tapped line, a mixed power transmission line, a meshed network, an overhead line, an underground cable, a subsea cable, a double-circuit line and a series compensated line.

A plurality of power system devices are distributed across the power transmission network. For example, a power system device may be associated with an end, or a junction between overhead lines and cables (or at other locations) of a power transmission line of the power transmission network. The one or more power system devices sample data at a corresponding one or more data sampling rates. Thus the data sampling rate can vary across power system devices. A power system device can perform one or more of, but not limited to, measurement, monitoring and protection functions. Examples of power system devices include Intelligent Electronic Devices (IEDs), Merging Units (MUs), Phasor Measurement Units (PMUs), standalone disturbance recorders (DRs), Remote Terminal Units (RTU) etc.

There are different types of power system devices in the power transmission network. Each power system device can perform one or more of measurement of data to generate measured data, and processing of the measured data to generate processed data in response to a condition in a corresponding segment of the power transmission network. For example, some devices can perform measurement functions, while some other can also process the measured data to implement certain functions such as monitoring and/or protection.

In an embodiment, a first power system device and second power system device measure data in response to a condition in a corresponding segment of the power transmission network. Here, the first device may be at a first end and sample data at a first sampling rate, while the second device may be at a second end and sample data at a second sampling rate, and the devices can measure the data at the corresponding ends. In accordance with the embodiment, the second power system device also processes the measured data to generate processed data. Thus fault data or disturbance data can have measured data and/or processed data, received from different power system devices that have same/different sampling rates. Such disturbance data may be stored as disturbance records for prognostic/diagnostic purposes.

In another embodiment, the first power system device processes the measured data. Here, the first power system device may sample data at a low sampling rate (e.g., <4 KHz). The processing at the first power system device may be performed to estimate a fault zone (i.e., a zone (or region/length/part of the line (e.g., few kilometers)) in which the fault is expected to have occurred). The fault zone information can be used for locating the fault with the disturbance data received from the second power system device (which may only be sampling data (i.e., not doing any processing) at a high sampling rate (e.g., >1 MHz).

In accordance with the invention, each power system device can communicate with a remote device. Such communication is enabled with a communication hardware, software and/or firmware of the power system device. For example, a power system device can have a communication module embedded therein for communication over a wired/wireless network. Taking another example, a power system device can communicate with the remote device through a gateway device or controller, wherein the gateway device or controller has such communication capabilities.

In case of a fault, one or more power system devices (or disturbance recorders) of the network generate fault data (disturbance data or disturbance records). For example, only one power system device may send disturbance data. In such a case, depending on the power system device, and line topology, suitable fault location technique can be selected for locating the fault. Considering that the power system device is an IED or MU, we get raw sampled data which can be time stamped. In case of a PMU, we get time synchronized phasor quantities. In case of a RTU, we get unsynchronized magnitude of the quantities. We cannot directly use these different types of data. Analysis has to be done to each of these to modify them suitably to work together. In case multiple power system devices send the disturbance data, the fault location technique selection will depend on the inputs received. For example, two power system devices can send disturbance data sampled at different sampling rate. Further, such disturbance data may also have fault location/zone estimations. Here, the inputs received from the different power system devices may be used together to estimate the fault location. For example, a fault zone estimated with disturbance data sampled at a first sampling rate (e.g., <4 KHz), can be used as input to locate the fault with disturbance data sampled at a second sampling rate (e.g., >1 MHz).

An aspect of the invention relates to a system for analyzing the fault data in the power transmission network. The system comprises a data aggregator, a data analyzer and a fault locator. The data aggregator receives disturbance data from one or more power system devices in response to a fault in a corresponding segment of the power transmission network. Here, the disturbance data received from a power system device comprises one or more of the measured data and the processed data. The type of data communicated from a power system device depends on the configuration and capability of the corresponding power system device.

A power system device can send disturbance data according to predetermined criteria. For example, all the power system devices connected with a line send disturbance data when a fault is detected in that line. Taking another example, only those power system devices that are associated with the affected sections (or zones/portions) of the line send disturbance data. Taking yet another example, a power system device may send raw data as measured (e.g., for a predetermined time before and after fault) along with processed data (such as fault location determined at the device).

In an embodiment, the system comprises a data pre-processor. The data pre-processor performs one or more of data validation and data synchronization. This depends on the power system device and/or communication. There may be a requirement to validate the data for errors, or synchronize data received from different devices. In an embodiment, the data pre-processor validates the disturbance data received from a power system device based on the device details of the power system device. Such validation may be performed with one or more validation techniques available with the data pre-processor. For example, the data validation may be performed using redundant measurements to identify the bad data and correct them, using domain principles like KVL and KCL.

In accordance with the embodiment, the data pre-processor synchronizes the disturbance data received from two power system devices based on the device details of the one or more power system devices. Such synchronization may be performed with one or more synchronization techniques available with the data pre-processor. For example, the data synchronization can be done using pre-fault phasors, sample to sample comparison from raw data, using state estimation or power flow techniques.

The disturbance data received from the one or more power system devices can be analyzed with one or more fault location techniques. A plurality of fault location techniques are available with the data analyzer (e.g., stored in an associated database). Such fault location techniques can be defined beforehand, and updated (or new techniques added) as and when needed. A fault location technique can be one of, but not limited to, a phasor based fault location technique, a time domain based fault location technique and a travelling wave based fault location technique. The fault location technique is selected by the data analyzer from the plurality of fault location techniques, according to one or more of device details of the power system device, and topology of the corresponding power transmission line of the power transmission network.

The device details are required to determine how the data received from the device is to be processed. Such details can include serial number, model, geographical location, manufacturer information, fault location techniques on the device and so forth. In an embodiment, the device details of each power system device identifies one or more of a data sampling rate of the power system device, measurement of data by the power system device and processing of the measured data by the power system device. The topology information of the power transmission network (and various lines/segments (or sections or parts) thereof) can be made available beforehand (e.g., stored in the database).

In an embodiment, the data analyzer selects the fault analysis technique(s) according to the data sampling rate of each power system device, and the topology of the corresponding segment of the power transmission network. The data analyzer selects the fault analysis technique according to the disturbance data received from the one or more power system devices. In accordance with an embodiment, a first fault analysis technique is selected for measured data, and a second fault analysis technique is selected for processed data. Different fault location techniques can be selected depending on the sampling rates, the participating devices, availability of data (measured/processed etc.). For example, if only one power system device sends data, then a corresponding fault location technique may be selected based on the disturbance data received from the corresponding device and the line topology. In case multiple devices send data, fault location estimates from one device may be used as input on disturbance data received from another device. Alternately, fault location estimates may be generated using disturbance data from different devices (and corresponding topology etc.). For example, in case of two ended fault location techniques data from the power system devices at both ends is required. Taking another example, fault location estimated from disturbance data of separate devices may be compared to estimate a fault location.

In an embodiment, the data aggregator receives the measured data from each power system device prior to the fault. In accordance with the embodiment, the data analyzer analyzes the measured data to determine one or more line parameters of the corresponding power transmission line of the power transmission network. The data analyzer can compare line parameters of one or more power transmission lines of the power transmission network to validate the line parameter data of the corresponding power transmission lines. In an embodiment, the data analyzer compares line parameters of a first power transmission line with line parameters of a second power transmission line, wherein the comparison is performed to validate the line parameter data of the second power transmission line based on the line parameter data of the first power transmission line.

The fault locator locates the fault in the power transmission network based on the fault location technique(s) selected by the data analyzer, the disturbance data received from the one or more power system devices, system parameters of the corresponding segment of the power transmission network and geographical information associated with the power transmission network. The segment or section can be an overhead line, an underground cable, wherein a segment starts at a substation and ends at another substation or junction. In other words a segment can imply the entire line or a section or part of the line (e.g., overhead line/cable etc.). In an embodiment of the invention, the system parameters comprise one or more of system frequency and line parameters. Here, the line parameters comprise one or more of line impedances, line lengths and velocity of propagation of a travelling wave in the line. The system parameters and geographical information can be available with the fault locator (e.g., stored in the database). In an embodiment, the geographical information of the network is determined from a geographical information system.

In an embodiment, the system further comprises a fault predictor for predicting faults based fault data collected over a period of time. For example, faults can be predicted based on a frequency of faults in one or more lines. Here, the data analyzer analyzes data of a plurality of faults collected over a period of time.

Another aspect of the invention relates to a method for analyzing fault data in the power transmission network. The method comprises receiving disturbance data from one or more power system devices in response to a fault in a corresponding segment of the power transmission network.

The method further comprises selecting a fault location technique for the disturbance data received from each of the one or more power system devices. Here, the fault location technique is selected according to one or more of device details of the power system device, and topology of the corresponding power transmission line of the power transmission network.

In addition, the method comprises locating the fault in the power transmission network based on the fault location technique, the disturbance data received from the one or more power system devices, the system parameters of the corresponding segment of the power transmission network and geographical information associated with the power transmission network.

Various embodiments and examples will now be described with reference to the drawings.

Referring to FIG. 1, which is a simplified representation of an environment (100) for analyzing fault data, in accordance with an embodiment of the invention. As shown, a plurality of power system devices (102a, 102b, 102c . . . ) are connected with a server (104). A power system device (PSD) can directly communicate with the server (see connection between device 102a and server 104), or via another device (see connection between 102b to server 104 via controller 106). In the latter case, the PSD communicates with a gateway device or a controller (106), which in turn communicates with the server. The server may be a cloud-based server. While a single server/controller is shown in FIG. 1, it should be apparent that there can be several servers and/or gateway devices or controllers. As an example, there may be a server for each substation, a group of substations or a region/zone. A data storage(s) (such as database 108) is also provided. In FIG. 1, the data storage is associated with the server; however there may be several data storages associated with various components such as PSDs, controllers or gateway devices.

In accordance with the invention, a PSD communicates measured and/or processed data to the server. The PSD can be connected with measurement equipment for measurement, monitoring and/or protecting a power transmission line or section thereof. Examples of power system devices include Intelligent Electronic Devices (IEDs), Merging Units (MUs), Phasor Measurement Units (PMUs), stand-alone disturbance recorders (DRs), Remote Terminal Units (RTU) etc. Consider the embodiment illustrated in FIG. 2, wherein a PSD (202) is associated with Bus A. The PSD receives one or more signals from one or more measurement equipment connected to the multi-terminal mixed line.

Figure 2:
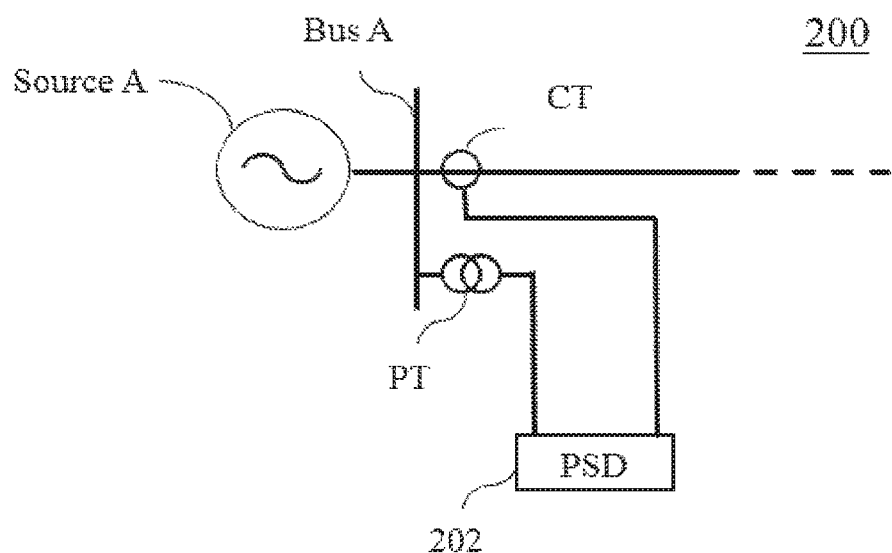
FIG. 2 is a simplified representation of a connection of a power system device for obtaining measurements of a power transmission line, in accordance with an embodiment of the invention.

In the example of FIG. 2, a current transformer (CT) provides single/multiple phase current signal and a potential transformer (PT) provides single/multiple phase voltage signal to the PSD. In another example, the measurement equipment publishes the measurements over a bus (e.g., process bus), and the PSD (e.g., subscribed to receive data from such bus) receives the measurements over the bus. While in FIG. 2 the PSD is shown to receive signal from two equipments, it may receive signal from one equipment only, or from more than two equipments, and such variations will be readily apparent to one of ordinary skill in the art.

Figure 3:
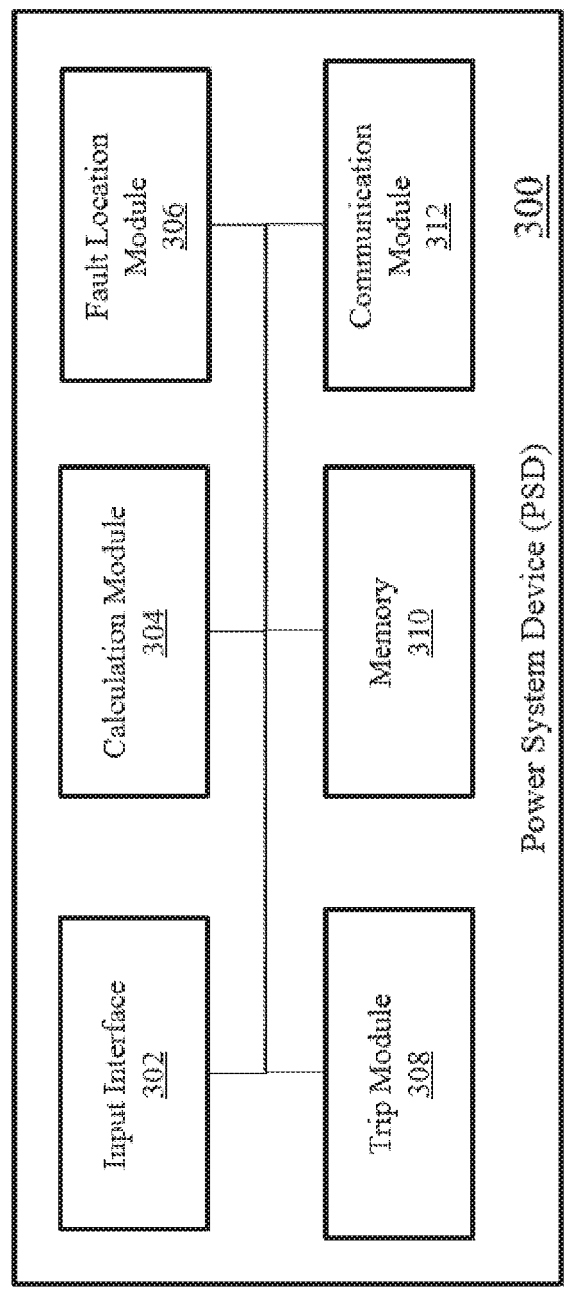
FIG. 3 is a block diagram of the power system device, in accordance with an embodiment of the invention.

A PSD can have one or multiple modules for performing the measurement, monitoring and/or protection functions. Consider an embodiment wherein the PSD is an IED that can perform measurement and protection functions. FIG. 3 is a simplified block diagram of a PSD (300) in accordance with the embodiment. As shown, the PSD includes an input interface (302), a calculation module (304), a fault location module (306), a trip module (308), a memory (310) and a communication module (312). The plurality of modules may be implemented using a processor of the PSD. The PSD may receive some values from another device (say another IED), wherein the corresponding modules would be implemented using a processor of the corresponding device.

The input interface receives the signal from the measurement equipment (such as CT/PT shown in FIG. 2). The calculation module performs one or more calculations based on the signal received. For example, the calculation module can calculate current/voltage phasors from current/voltage signals. Taking another example, the calculation module can perform travelling wave related calculations such as calculating arrival times, peak values etc. The fault location module estimates a location of the fault with a fault location technique. For example, the PSD can be configured to estimate a section of the line with the fault, or to estimate the fault location using a phasor based technique, or a travelling wave based technique. The trip module generates a trip signal for controlling a switching device (e.g., circuit breaker), in response to a fault section identification.

The memory stores the disturbance data collected at the PSD. Such data may be stored for a particular period of time, after which it can be erased from the memory. The memory may also store required fault section identification/location techniques, or information corresponding to updating application of such techniques for identifying faulted section/estimating the fault location. The disturbance data recorded with the PSD is communicated via the communication module of the PSD. It should be apparent the modules shown in FIG. 3 are merely illustrative, and a PSD may have less, more or other modules as per the function provided by the PSD. For example, the PSD may include modules for obtaining phasors from current/voltage signals, travelling wave parameters, data cleaning etc.

In case of a fault, one or more PSDs of the network generate fault data (also referred here as 'disturbance data'). Such disturbance data may be stored and communicated as disturbance records for prognostic/diagnostic purposes. A PSD can send disturbance data according to predetermined criteria. For example, all the power system devices connected with a line send disturbance data when a fault is detected in that line. Taking another example, only those power system devices that are associated with the affected sections (overhead/cable) of the line send disturbance data. Taking yet another example, a power system device may send raw data as measured (e.g., for a predetermined time before and after fault) along with processed data (such as fault location determined at the device).

In accordance with some embodiments, disturbance data generated by a PSD will be continuous event logging of both binary and analog signals with accurate time tagging. Analog signals will mainly be the voltage and current measurements at the terminal (or junction or point) at which the PSD is employed. Pre-trigger (data before the system disturbance), during-trigger (during the early period of system disturbance) and post-trigger (data during the middle and late periods of system disturbance) recording for few cycles will be done. Disturbance recorders generally support IEC 61850, DNP.3, IEC, etc. communication, and the generated data is sent to the server.

The fault can be detected by the PSD(s) itself, or at a fault detector (another PSD or controller) and communicated to the PSD. The disturbance data can have data samples collected prior to and/or post the fault. Further, the disturbance data can include only measured data, or only processed data or a combination of measured and processed data, as per the configuration of the corresponding PSD. The disturbance data collected from various PSDs can be analyzed by the system and method disclosed herein.

Figure 4:
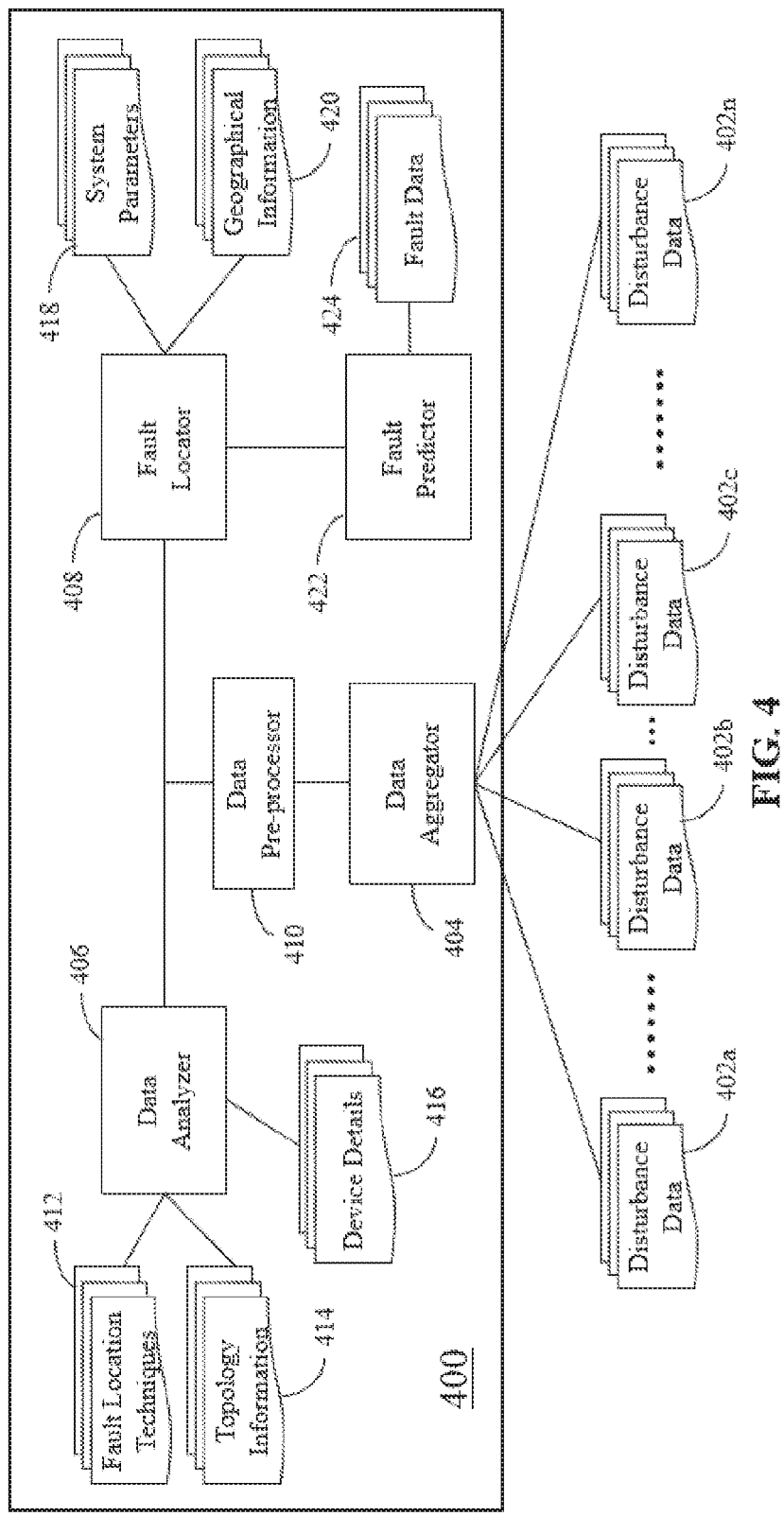
FIG. 4 is a simplified representation of a system for analyzing fault data, in accordance with an embodiment of the invention.

FIG. 4 is a simplified representation of the system (400) for analyzing fault data, in accordance with an embodiment of the invention. As shown, the system comprises a data aggregator (404), a data analyzer (406) and a fault locator (408).

The data aggregator receives disturbance data from one or more PSDs in response to a fault in a corresponding segment of the network. For example, the data aggregator receives disturbance data 402a, 402b, 402c etc., wherein such data is generated by PSDs such as PSD 102a, 102b, 102c etc. as shown in FIG. 1.

The system optionally comprises a data pre-processor (410). The data pre-processor performs one or more of data validation and data synchronization. This depends on the PSD and/or communication. In an embodiment, the data pre-processor validates the disturbance data received from a PSD based on the device details. Such validation may be performed with one or more validation techniques (not shown in FIG. 4) available with the data pre-processor. For example, the data validation may be performed using redundant measurements to identify the bad data and correct them, using domain principles like KVL and KCL.

In accordance with the embodiment, the data pre-processor synchronizes the disturbance data received from two PSDs based on the device details of the one or more PSDs. Such synchronization may be performed with one or more synchronization techniques available with the data pre-processor (not shown in FIG. 4). For example, the data synchronization can be done using pre-fault phasors, sample to sample comparison from raw data, using state estimation or power flow techniques.

The data analyzer (406) receives the data aggregated with the data aggregator. A plurality of fault location techniques (412) are available with the data analyzer. Such fault location techniques may be stored in an associated data storage (not shown in FIG. 4). Such fault location techniques can be defined beforehand, and updated (or new techniques added) as and when needed. A fault location technique can be one of, but not limited to, a phasor based fault location technique, time-domain based fault location technique and a travelling wave based fault location technique. The topology information (414) of the power transmission network (and various lines/segments (or sections or parts) thereof) is also available with the data analyzer. The system topologies can be any of the different power system configurations such as multi-terminal lines, tapped lines, mixed lines, meshed networks, underground cable systems, double-circuit lines, series compensated lines etc. Such topology information may be stored in an associated data storage (not shown in FIG. 4).

When a fault is detected, and correspondingly the disturbance data received, the data analyzer selects the fault analysis technique. The selection can be performed for each PSD that sent the data. Alternately, the technique may apply for data received from two or more PSDs associated with the line. Different fault location techniques can be selected depending on the sampling rates, the participating devices, availability of data (measured/processed etc.). For example, if only one power system device sends data, then a corresponding fault location technique may be selected based on the disturbance data received from the corresponding device and the line topology. In case multiple devices send data, fault location estimates from one device may be used as input on disturbance data received from another device. Alternately, fault location estimates may be generated using disturbance data from different devices (and corresponding topology etc.). For example, in case of two ended fault location techniques data from the power system devices at both ends is required. Taking another example, fault location estimated from disturbance data of separate devices may be compared to estimate a fault location.

The data analyzer selects the fault location technique from the plurality of fault analysis techniques (i.e., from 412); according to one or more of device details (416) of the PSD, and topology of the corresponding power transmission line of the power transmission network (i.e., from 414). The device details are required to determine how the data received from the device is to be processed. Such details can include serial number, model, geographical location, manufacturer information, fault location techniques on the device (in case it processes the measured data) and so forth.

The device details of each PSD identifies one or more of a data sampling rate of the PSD, measurement of data by the PSD and processing of the measured data by the PSD. For example, it can be determined from the device details if the PSD is a MU for measuring currents at about 1-4 kHz. Taking another example, it can be determined if the PSD is an IED that can implement protection and auto-recloser from the device details. Such details are also available with the data analyzer (416), and can be updated as and when required.

The data analyzer selects the fault location technique according to the data sampling rate of the PSD(s), while considering the topology of the corresponding segment of the power transmission network. Further, depending on the disturbance data containing only measured data or processed data, or a combination of both, the data analyzer can select a corresponding fault location technique. For example, a first fault location technique is selected in case disturbance data has only measured data. A second fault location technique is selected in case disturbance data has only processed data etc. Also, as mentioned, the technique selection can depend on whether data from two ends is required, or data from multiple devices is to be analyzed.

Once the fault location technique is selected, the disturbance data can be analyzed to obtain a fault location. For example, a phasor based estimation can be performed to obtain an estimate for the fault location. Such location is relative to the PSD or with respect to the corresponding line, which when combined with the geographical information of the line gives the geographical location of the fault. The fault locator (i.e., 408) locates the fault in the network based on the fault location technique, the disturbance data received, the system parameters (418) of the corresponding segment of the network and geographical information (420) associated with the network. Different fault location techniques require different system parameters. For example, travelling wave based techniques may require wave velocity, line impedance, line length etc., which phasor based techniques may require current/voltage phasors, impedances etc.

The system parameters can include one or more of, but not limited to, system frequency and line parameters. Here, the line parameters comprise one or more of line impedances, line lengths and velocity of propagation of a travelling wave in the line. The system parameters and geographical information can be available with the fault locator (e.g., stored in the database). The geographical information of the network can be determined from a geographical information system, or entered in the system (once the same is known).

There may be differences in system parameters aggregated for different lines (e.g., received during installation). This can be linked to variation in data consolidation from different systems, testing performed etc. The system disclosed herein can assist in harmonizing the system parameter information across different lines (or sections) of the same type. The data aggregator can aggregate the data measured with each PSD prior to the fault. Such data can be analyzed (e.g., with the data analyzer) to determine one or more line parameters of the corresponding lines (or sections) of the network. Further, line parameters of one or more lines can be compared to validate the line parameter data of the corresponding lines. For example, line parameter data may be accurately recorded for a first line, and such data may be used to improve the fault location estimate for another line (which is of a similar type). For example, there may be two ZEBRA/DOG lines. In such a case, the line parameter data of similar lines may be compared to check if the line parameter data is accurately recorded for the different lines.

The system optionally comprises a fault predictor (422) for analyzing available fault data (424) to perform one or more predictions. Such analysis can be performed to determine frequency of faults etc.

Various components of the system may be implemented with one or more processors at the server (such as 104), or with one or more processors of a server and one or more processors of PSDs. In an embodiment, the data aggregator, the data analyzer and the fault locator are implemented with a processor on the server. The data pre-processor and the fault predictor can also be implemented with the processor of the server. In another embodiment, the data aggregator is implemented with a processor of a gateway device (or controller (106)) and a processor of the server, wherein the gateway device may be connected with two or more PSDs. In such a case, the gateway device can aggregate the data from the corresponding PSDs and forward to the server. Here, the gateway device may optionally perform some analysis on the aggregated data prior to forwarding the data to the server. In yet another embodiment, the data analyzer is implemented with the processor of the server and processors of the one or more PSDs. In accordance with the embodiment, the processor at a corresponding PSD processes the data measured at the PSD, and sends the processed data to the server, which uses the same for further analysis. Here, the measured data (or raw data) may also be transmitted to the server.

Figure 5:
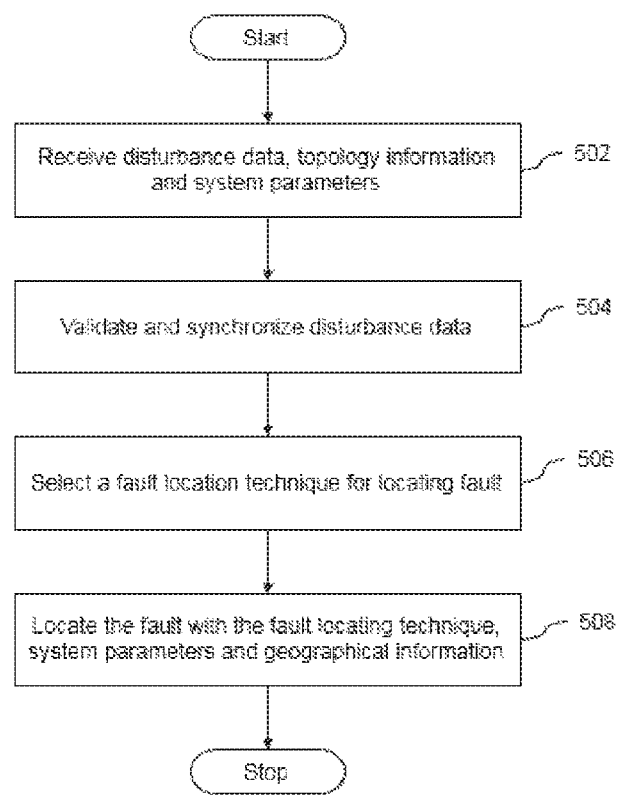
FIG. 5 is a flowchart of a method for analyzing fault data, in accordance with an embodiment of the invention.

The components of the system disclosed herein can be used to locate fault anywhere in the network. Referring to FIG. 5, which is a flowchart of a method for locating the fault in accordance with an embodiment of the invention. At 502, the disturbance data from the different disturbance recorders (PSDs or DRs) are aggregated (e.g., with the data aggregator at the server (104)). Along with the disturbance data, the system topology details as well as the system parameters and the geographical information are also aggregated. The topology information (414), the system parameters (418), the geographical information (420) can be aggregated beforehand.

After the data is obtained, at 504, optionally, various data preprocessing steps are performed including, but not limited to, data validation, data synchronization etc. Data validation includes identification and removal of bad data. Data synchronization is done for unsynchronized data.

Different fault location techniques suitable for various system configurations such as multi-terminal tapped lines, double circuit lines, meshed networks, mixed lines, underground cables etc. are available on the system (e.g., fault location techniques 412). This offers the ability to select the optimal fault location techniques from a single platform, from among various fault location techniques.

A fault location technique is selected at 506. The selection can be based on the data availability and data sampling rates of the corresponding PSDs. An option may be provided to select one of different available fault location techniques. For example, various phasor estimation techniques may be available from which the most suitable or preferred one can be selected. The fault location is determined at 508 with the fault location technique, the disturbance data, system parameters of the corresponding line (or section thereof) and geographical information associated with the network.

As an example, a low sampling rate based fault location technique may be selected. This fault location technique can be a phasor based technique for use in cases where the sampling rate is between 1-4 KHz. After data validation and synchronization (as needed), phasor estimation is done to estimate the voltage and current phasors. Using these estimated phasors and the system parameters, a phasor-based fault location technique is used to identify the faulted location.

Taking another example, a high sampling rate based fault location technique can be selected. This fault location technique can be a travelling wave based technique for use in cases where the sampling rate is about 500 KHz-1 MHz. The technique uses travelling wave approach to identify the faulted location. From the disturbance records, travelling waves are extracted and the wave arrival times at different terminals are identified. Using this information along with the system topology and propagation velocity of the lines, the fault location is accurately calculated.

Taking yet another example, a very high sampling rate based fault location technique can be selected. This fault location technique can also be a travelling wave based technique for use in cases where the sampling rate is as high as 5-10 MHz. This technique also uses travelling wave or time domain based approach to identify the faulted location, and is suitable for underground cable systems. In underground cables, the accuracy requirement is higher and hence higher sampling rate is essential to attain good accuracy. From the disturbance records, travelling waves are extracted and the wave arrival times at different terminals are identified. Using this information along with the system topology and length of the line and propagation velocity, the fault location is accurately calculated.

Thus with disturbance records available, advance fault location techniques can be applied with the system and method disclosed herein, thereby the location determination is not restricted to the fault location technique implemented in the PSD or IED.

Consider a scenario where a first IED (A) at the first substation has a lower sampling rate, may be <4 KHz, and a second IED (B) at a second substation has a very high sampling rate, may be >1 MHz. In this scenario, the traditional IED based solutions would give two options—(1) phasor-based single-ended fault location using low sampling rate data from IED A, or (2) travelling-wave based single-ended fault location using the high sampling rate data from IED B. Both these options have their own drawbacks. Drawback of option 1 being low accuracy and drawback of option 2 being not knowing if the fault is on first half or second half of the line (this is required for proper selection of reflections). The invention facilitates the efficient use of both the low sampled and high sampled data together for a much accurate fault location solution. That is using the single ended low sampled data based solution, fault zone can be identified. Once the fault zone is identified, the single ended high sampling rate based fault location solution can be used to pin point the fault location. Thus, different type of data from different PSDs can be used to improve accuracy of fault location.

The system and method disclosed herein also assist in handing system variations. Transmission line parameters vary with ambient system conditions like temperature, aging of the line, etc. The fault location accuracy can be affected by the line parameters. The line parameters can be estimated based on the recorded pre-fault data uploaded to the server and used for fault location estimation.

The system and method disclosed herein also provide for easier upgradation upon availability of new fault location techniques. For example, if a more accurate phasor estimation technique or a more efficient fault location technique is developed, these can be easily made available to the users. In the case of current fault location solutions placed on IEDs, an upgrade or a new solution would mean upgradation of each one of them. Also, if better estimates of fault location from the server can be communicated for display at the PSDs.

The availability of the data at a centralized server further facilitates various analytical functions. The information on number of faults that has occurred in a particular area or on a particular line can help in calculation of reliability indices. For example, System Average interruption frequency (SAIFI) can be an index which gives an idea about how frequent the faults and outages are in particular line.

The system and method also provide for fine tuning for better accuracy of line impedance parameters. Overhead lines have standard nomenclatures and corresponding standard specifications such as, but not limited to, standard diameter, weight and resistance values. The availability of the overhead line details and parameters from different lines on a single server can be used for fine tuning of these parameters. Consider the case where two users namely A and B have the same type of conductor, say, MOOSE. From previous fault location results it was found that line parameters provided by user A were more accurate than those given by B. This information can be used to fine tune the line parameters of B based on the more accurate parameters provided by A, thus ensuring more accurate fault location for user B next time.

Another similar use case can be when the line impedance parameters of user B are not available due to some reason, but it is known that the conductor is MOOSE. In this case the available line parameters from user A can be used for fault location for user B, thus rendering the service even when complete data is not available.

The system and method can also incorporate geographical information system (GIS) which helps to pin the identified fault location on the map. This can be further integrated with a crew management system, thus making the dispatch of crew to the location for fault clearance more efficient.

The invention claimed is:

1. A system for analyzing fault data in a power transmission network with a plurality of power transmission lines, wherein a plurality of power system devices are distributed across the power transmission network, each power system device configured to perform one or more of measurement of data to generate measured data and processing of the measured data to generate processed data in response to a condition in a corresponding segment of the power transmission network, the system comprising:
a data aggregator configured to receive disturbance data from one or more power system devices of the plurality of power system devices in response to a fault in the corresponding segment of the power transmission network, wherein the received disturbance data comprises one or more of the measured data and the processed data, and wherein the one or more power system devices sample data at a corresponding one or more data sampling rates;
a data analyzer configured to select a fault location technique from a plurality of fault location techniques, wherein the data analyzer is configured to select the fault location technique depending on the data sampling rate of the corresponding power system device of the one or more power system devices, and a topology of a corresponding power transmission line of the power transmission network, wherein the fault location technique is one of a phasor based fault location technique, a time domain based fault location technique, or a travelling wave based fault location technique; and
a fault locator configured to locate the fault in the power transmission network based on the fault location technique selected by the data analyzer, the received disturbance data, system parameters of the corresponding segment of the power transmission network, and geographical information associated with the power transmission network.

2. The system of claim 1, wherein the data analyzer is configured to select the fault location technique according to the disturbance data received from corresponding power system devices of the one or more power system devices, wherein a first fault location technique is selected for measured data, and a second fault location technique is selected for processed data.

3. The system of claim 1, wherein the fault locator is configured to use a fault zone received from a first power system device of the one or more power system devices that samples data at a first data sampling rate for locating the fault with the disturbance data received from a second power system device of the one or more power system devices that samples data at a second data sampling rate.

4. The system of claim 1, wherein the data aggregator is configured to receive the measured data from the one or more power system devices prior to the fault, and the data analyzer is configured to analyze the measured data to determine one or more line parameters of the corresponding power transmission line of the power transmission network.

5. The system of claim 1, wherein the data analyzer is configured to compare line parameter data of a first power transmission line with line parameter data of a second power transmission line, wherein the comparison is performed to validate the line parameter data of the second power transmission line based on the line parameter data of the first power transmission line.

6. The system of claim 1, further comprising a fault predictor configured to predict faults based on fault data collected over a period of time.

7. The system of claim 1 further comprising a data pre-processor, wherein the data pre-processor is configured to perform data validation of the disturbance data from a power system device of the one or more power system devices, or data synchronization of the disturbance data from the one or more power system devices.

8. The system of claim 1, wherein the system parameters comprise system frequency or line parameters, and wherein the line parameters comprise line impedances, line lengths, or velocity of propagation of a travelling wave in the line.

9. A method for analyzing fault data in a power transmission network with a plurality of power transmission lines, wherein a plurality of power system devices are distributed across the power transmission network, wherein each power system device performs one or more of measurement of data to generate measured data and processing of the measured data to generate processed data in response to a condition in a corresponding segment of the power transmission network, the method comprising:
- receiving disturbance data from one or more power system devices of the plurality of power system devices in response to a fault in the corresponding segment of the power transmission network, wherein the disturbance data received from the one or more power system devices comprises one or more of the measured data and the processed data, wherein the one or more power system devices sample data at a corresponding one or more data sampling rates;
- selecting a fault location technique from a plurality of fault location techniques, wherein the fault location technique is selected depending on the data sampling rate of the corresponding power system device of the one or more power system devices, and a topology of corresponding power transmission line of the power transmission network, wherein the fault location technique is one of a phasor based fault analysis technique, a time domain based fault location technique and a travelling wave based fault; and
- locating the fault in the power transmission network, based on the fault location technique, the received disturbance data, system parameters of the corresponding segment of the power transmission network and geographical information associated with the power transmission network.

10. The method of claim 9, wherein the selecting comprises selecting the fault location technique according to the disturbance data received from corresponding power system devices, wherein a first fault location technique is selected for measured data, and a second fault location technique is selected for processed data.

11. The method of claim 9, wherein a fault zone is received from a first power system device of the one or more power system devices that samples data at a first sampling rate for locating the fault with the disturbance data received from a second power device of the one or more power system devices that samples data at a second sampling rate.

12. The method of claim 9, further comprising receiving the measured data from the one or more power system devices prior to the fault and analyzing the measured data to determine one or more line parameters of the corresponding power transmission line of the power transmission network.

13. The method of claim 9, further comprising comparing line parameter data of a first power transmission line with line parameter data of a second power transmission line, wherein the comparing is performed to validate the line parameter data of the second power transmission line based on the line parameter data of the first power transmission line.

14. The method of claim 9, further comprising predicting fault based on fault data collected over a period of time.

15. The method of claim 9 further comprising performing data validation of the disturbance data from a power system device of the one or more power system devices.

16. The method of claim 9 further comprising performing data synchronization of the disturbance data from the one or more power system devices.

17. The method of claim 9, wherein the system parameters comprise system frequency or line parameters, and wherein the line parameters comprise line impedances, line lengths, or velocity of propagation of a travelling wave in the line.

18. A transmission system comprising:
- a plurality of power transmission lines arranged in a power transmission network;
- a plurality of power system devices distributed across the power transmission network, each power system device configured to perform one or more of measurement of data to generate measured data and processing of the measured data to generate processed data in response to a condition in a corresponding segment of the power transmission network;
- a data aggregator configured to receive disturbance data from one or more power system devices of the plurality of power system devices in response to a fault in the corresponding segment of the power transmission network, wherein the received disturbance data comprises one or more of the measured data and the processed data, and wherein the one or more power system devices sample data at a corresponding one or more data sampling rates;
- a data analyzer configured to select a fault location technique for the received disturbance data, wherein the data analyzer is configured to select the fault location technique depending on the data sampling rate of the corresponding power system device of the one or more power system devices, and a topology of a corresponding power transmission line of the power transmission network, wherein the fault location technique is one of a phasor based fault location technique, a time domain based fault location technique, or a travelling wave based fault location technique; and
- a fault locator configured to locate the fault in the power transmission network based on the fault location technique selected by the data analyzer, the received disturbance data, system parameters of the corresponding segment of the power transmission network, and geographical information associated with the power transmission network.

19. The transmission system of claim 18, wherein a first power system device of the one or more power system devices is configured to sample data at a first data sampling rate and a second power system device of the one or more power system devices is configured to sample data at a second data sampling rate different from the first data sampling rate.

20. The transmission system of claim 19, wherein the fault locator is configured to use a fault zone received from the first power system device for locating the fault with the disturbance data received from the second power system device.

* * * * *